(12) United States Patent
Caimi et al.

(10) Patent No.: US 7,091,570 B2
(45) Date of Patent: Aug. 15, 2006

(54) MOS DEVICE AND A PROCESS FOR MANUFACTURING MOS DEVICES USING A DUAL-POLYSILICON LAYER TECHNOLOGY WITH SIDE CONTACT

(75) Inventors: Carlo Caimi, Cinisello Balsamo (IT); Paolo Caprara, Milan (IT); Valentina Tessa Contin, Milan (IT); Davide Merlani, Monza (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/745,297

(22) Filed: Dec. 23, 2003

(65) Prior Publication Data

US 2005/0116288 A1 Jun. 2, 2005

(30) Foreign Application Priority Data

Dec. 24, 2002 (IT) ............................ TO2002A1118

(51) Int. Cl.
*H01L 29/76* (2006.01)
(52) U.S. Cl. ....................................... 257/412; 257/773
(58) Field of Classification Search ................ 257/412, 257/413, 316, 773
See application file for complete search history.

(56) References Cited

U.S. PATENT DOCUMENTS

| 4,719,184 A | 1/1988 | Cantarelli et al. ............. 437/24 |
| 5,023,679 A * | 6/1991 | Shibata ......................... 257/344 |
| 5,326,999 A | 7/1994 | Kim et al. .................... 275/315 |
| 5,851,880 A | 12/1998 | Ikegami ....................... 438/258 |
| 6,387,745 B1 | 5/2002 | Onoda et al. ................ 438/237 |
| 6,548,857 B1 * | 4/2003 | Dalla Libera et al. ...... 257/315 |
| 6,680,514 B1 | 1/2004 | Geffken et al. ............. 257/368 |
| 6,818,932 B1 * | 11/2004 | Nii et al. ..................... 257/288 |
| 2002/0127802 A1 | 9/2002 | Goda et al. .................. 438/257 |
| 2004/0188759 A1 | 9/2004 | Contin et al. ................ 257/343 |
| 2005/0116288 A1 * | 6/2005 | Caimi et al. ................. 257/343 |

FOREIGN PATENT DOCUMENTS

EP 0 996 162 A1 4/2000

* cited by examiner

*Primary Examiner*—Mark V. Prenty
(74) *Attorney, Agent, or Firm*—Lisa K. Jorgenson; Hai Han; Seed IP Law Group PLLC

(57) ABSTRACT

A MOS device has: a semiconductor body defining a surface; a stack on top of the semiconductor body; and a passivation layer on top of the semiconductor body and covering the stack. The stack is formed by a first polysilicon region and by a second polysilicon region arranged on top of one another and separated by an intermediate dielectric region. An electrical connection region extends through the passivation layer as far as the surface of the semiconductor body laterally with respect to, and in contact with, the first and the second polysilicon regions so as to contact them electrically.

14 Claims, 4 Drawing Sheets

MOS DEVICE AND A PROCESS FOR MANUFACTURING MOS DEVICES USING A DUAL-POLYSILICON LAYER TECHNOLOGY WITH SIDE CONTACT

CROSS-REFERENCE TO RELATED APPLICATION

This application claims priority to Italian Patent Application No. TO2002A 001118 entitled "MOS DEVICE AND A PROCESS FOR MANUFACTURING MOS DEVICES USING DUAL-POLYSILICON LAYER TECHNOLOGY WITH SIDE CONTACT", filed on Dec. 24, 2002, which is incorporated herein by reference in its entirety.

BACKGROUND OF THE INVENTION

1. Field of the Invention

The present invention relates to a MOS device and to a process for manufacturing MOS devices using a dual-polysilicon layer technology with side contact.

2. Description of the Related Art

As is known, simultaneous fabrication in a same integrated device of dual-layer polysilicon memory cells and transistors requires removal of the polysilicon layer overlying the dielectric and of the intermediate dielectric layer in the circuitry area, where the transistors or the electrical connection are made, or forming an electrical connection between the first and the second polysilicon layers for the individual transistors.

In particular, U.S. Pat. No. 4,719,184, filed in the name of the present applicant, describes a process, referred to as the double-poly-short-circuited (DPCC) process, which enables short-circuiting between the first and second polysilicon layers. According to the aforesaid process, after deposition of the first polysilicon layer and of an interpoly-dielectric layer, part of the interpoly-dielectric layer is removed in the circuitry area, using a purposely designed mask referred to as "matrix mask". This mask enables removal of all of the interpoly dielectric on top of the active area of the transistors, or in preset portions, on top of or outside the active area. In this way, when the second polysilicon layer is deposited, it directly contacts the first polysilicon layer where the interpoly dielectric has been removed.

According to a further possibility, the electrical connection between the first and second polysilicon layers is obtained using a connection region, the production of which requires two masking and etching steps. In fact, first it is necessary to remove part of the second polysilicon layer and of the interpoly-dielectric layer so as to expose part of the first polysilicon layer, and then to open the vias through the passivation layer, for forming the connection region.

The above solution is represented in FIGS. 1 and 2, which illustrate, respectively, a top view and a cross-section of a MOS transistor obtained using the process described. In FIGS. 1 and 2, a body 1, of semiconductor material, has an insulation region 2 surrounding an active area 3 (FIG. 1). A stack 4 extends on top of the body 1 and comprises (FIG. 2): a gate-oxide region 5; a poly1 region 6; an interpoly-dielectric region 7; a poly2 region 8; and a silicide region 9.

Spacing regions 10 are formed at the sides of the stack 4, and a passivation layer 11 extends on top of the body 1. A plug 12 extends through the passivation layer 11 as far as the stack 4.

FIG. 1 moreover illustrates the shape of the mask that enables forming the first hole, which has an opening 15 that allows the removal of a portion of the silicide region 9, the poly2 region 8, and the interpoly region 7. Thus, these regions have a width smaller than the poly1 region 6, as may be seen in the cross-section of FIG. 2. FIG. 1 moreover illustrates a subsequent mask having, i.e., an opening 12a for the plug 12, which is staggered with respect to the opening 15, and in particular is set on top of both of the remaining portions of the silicide region 9 and the poly2 region 8 and on top of the portion of the poly1 region 6 not overlaid by the silicide region 9 and the poly2 region 8 to ensure the polysilicon regions 6, 8 to be electrically connected by the plug 12. The plug 12 thus has a step at the silicide layer 9 and, in its bottom part, alongside the regions 7 to 9, has a cross-sectional area much smaller than the top part (on top of the stack 4).

Both for the solution just described and for the solution described in the U.S. Pat. No. 4,719,184, it is disadvantageous that two masks are necessary for electrically connecting poly1 and poly2, and hence the costs of fabrication are high.

BRIEF SUMMARY OF THE INVENTION

One aim of the present invention is to provide a manufacturing process which does not require specially designed masks for contacting the two polysilicon layers in the circuitry transistors built using a dual polysilicon-layer technology.

According to the present invention, there are provided a MOS device and a process for manufacturing MOS devices, as defined in claims 1, 6 13 and 18 respectively.

BRIEF DESCRIPTION OF THE DRAWINGS

For a better understanding of the invention, the embodiments thereof are now described, purely by way of non-limiting example, with reference to the attached drawings, wherein.

DETAILED DESCRIPTION OF THE INVENTION

According to one aspect of the invention, for electrically connecting polysilicon layers, just one mask is used, and precisely the mask already used for opening the contacts, and the contact is made using a conductive region or plug extending through the dielectric layer which coats the substrate laterally with respect to the polysilicon layers, according to what is illustrated in FIGS. 3 to 9.

Figure 1:
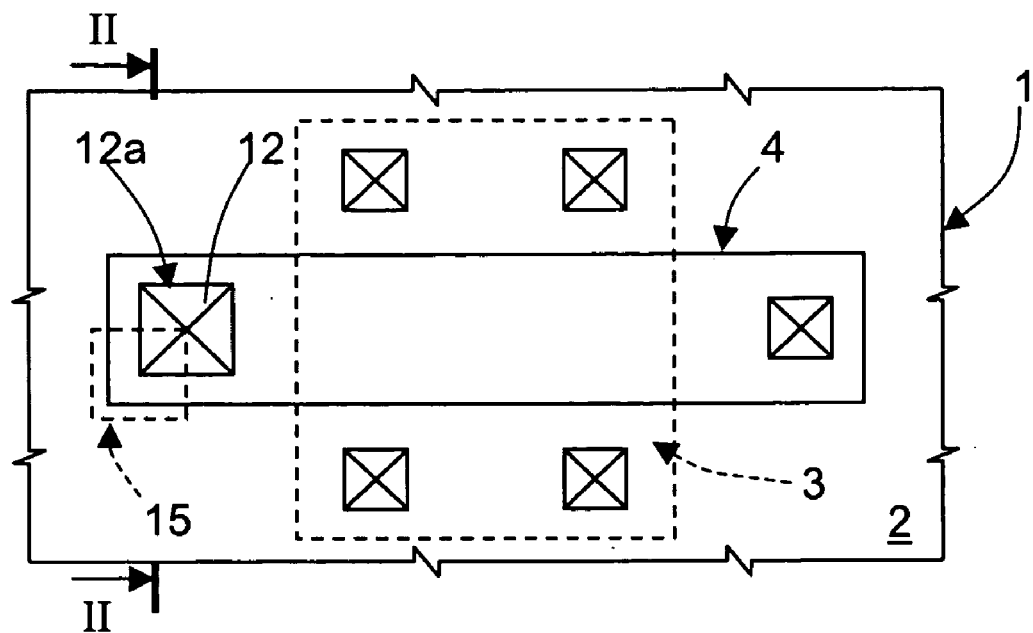
FIG. 1 illustrates the layout of a MOS transistor made with a dedicated mask for connecting the two polysilicon layers.
Figure 2:
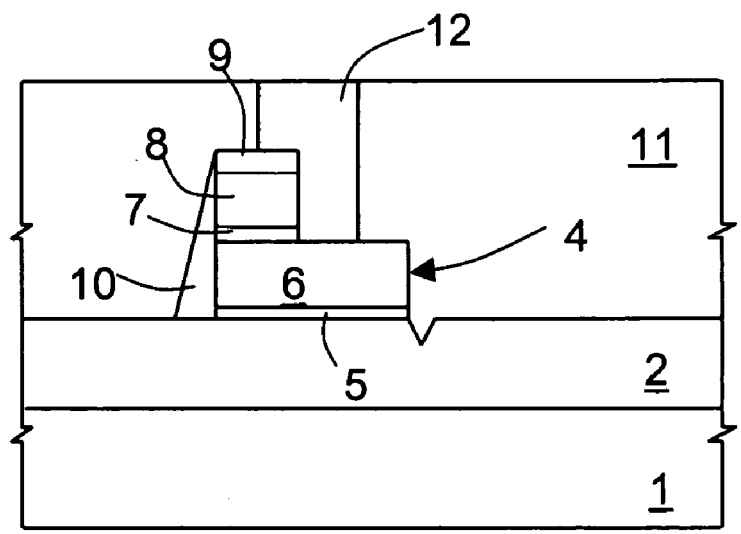
FIG. 2 is a cross-sectional view of the transistor of FIG. 1.
Figure 3:
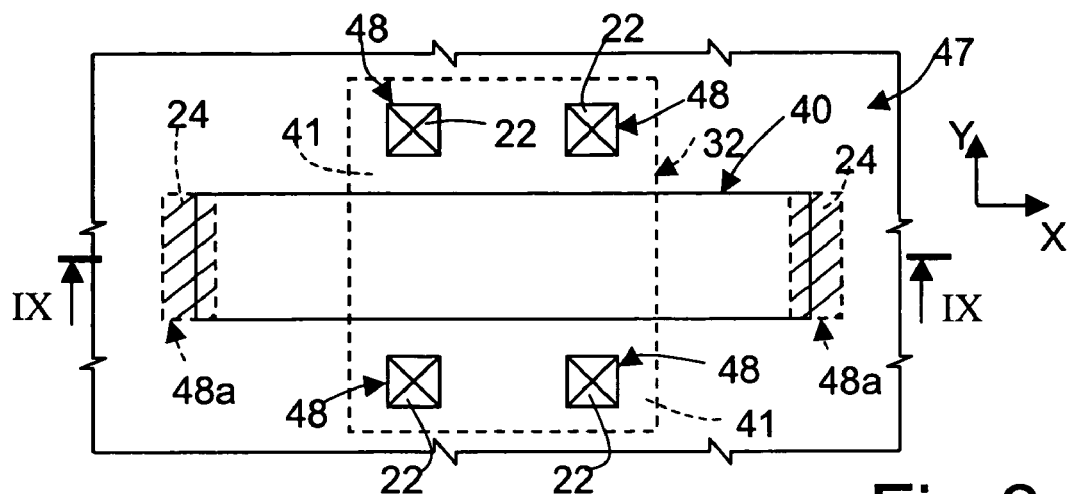
FIG. 3 illustrates the layout of a first embodiment of the transistor according to the invention.
Figure 4:
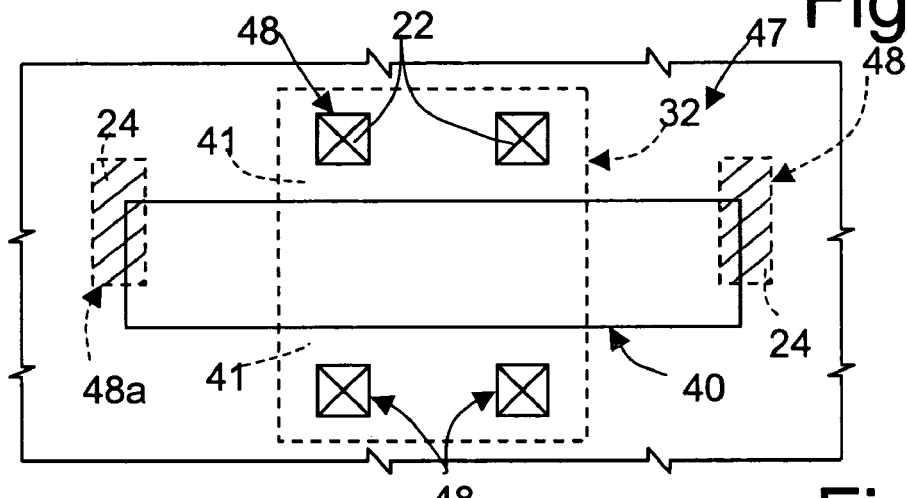
FIG. 4 illustrates the layout of a second embodiment of the transistor according to the invention.
Figure 5:
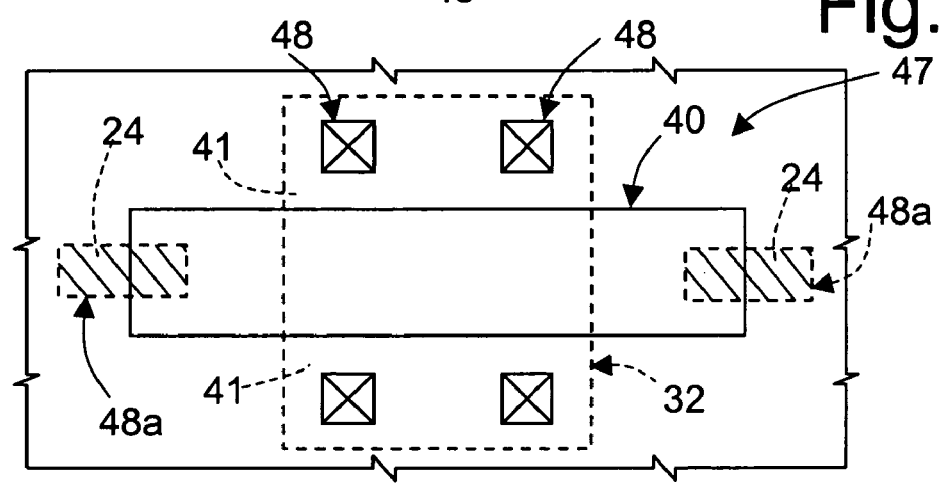
FIG. 5 illustrates the layout of a third embodiment of the transistor according to the invention.

In particular, FIGS. 3 to 5 illustrate, hatchings, an active area 32, accommodating source and drain regions 41 (illustrated only schematically), contacted using plugs 22. A stack 40 extends transversely to the active area 32 and includes two polysilicon regions electrically connected to one another by two electrical connection regions 24, as described in greater detail hereinafter with reference to FIGS. 6–9. Both the stack 40 and the electrical connection regions 24 have a rectangular shape, with the electrical connection regions 24 partially overlapping the ends of the stack 40.

FIG. 3 illustrates a solution wherein the electrical connection regions 24 have a length equal to the width of the stack 40, i.e., they have the same size in the Y direction, and are aligned to the stack 40. FIG. 4 illustrates a solution wherein the electrical connection regions 24 have a length equal or similar to the width of the stack 40, but are staggered laterally with respect to the latter. FIG. 5 illustrates a solution wherein the electrical connection regions 24 are rotated with respect to FIGS. 3 and 4 and have a width (in the Y direction) smaller than the width of the stack 40.

Next, with reference to FIGS. 5 to 9, a manufacturing process, of self-aligned type, is described. The process initially comprises standard fabrication steps, which include: defining the active areas 32, forming field insulation regions, for example using a shallow-trench technique; depositing a gate-oxide layer; depositing a first polycrystalline-silicon layer (poly1 layer); depositing an interpoly-dielectric layer; depositing a second polysilicon layer (poly2 layer); depositing a silicide layer; defining the gate stack 40 using a stack-definition mask; and selectively removing portions of the silicide layer, poly2 layer, interpoly dielectric layer, poly1 layer, and gate oxide layer. In the process described, an LDD implant is performed, and spacers are formed on the sides of the gate stack. Next, the source and drain regions 41 are implanted, and then, a passivation layer is deposited.

Figure 6:
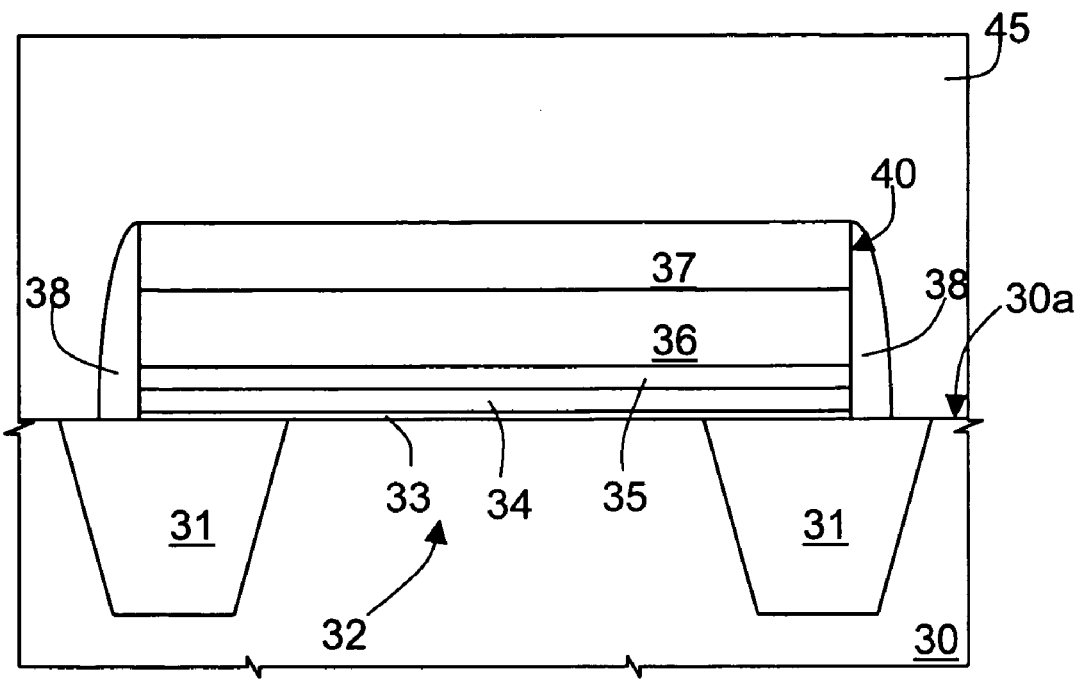
FIGS. 6 to 9 illustrate cross-sectional views, taken along line IX—IX of FIG. 3, but valid also for the embodiments of FIGS. 4 and 5, in successive manufacturing steps of the transistor according to the invention.

The structure thus obtained is illustrated in FIG. 6 and comprises: a semiconductor body 30 having a surface 30*a*; a field insulation region 31, which delimits, inside the semiconductor body 30, an active area 32; and a stack 40, extending on top of the surface 30*a* of the semiconductor body 30.

The stack 40 comprises a gate oxide region 33; a poly1 region 34, arranged on top of the gate oxide region 33; an interpoly dielectric region 35, arranged on top of the poly1 region 34 and formed by a triple ONO (oxide-nitride-oxide) layer; a poly2 region 36, arranged on top of the interpoly-dielectric region 35; and a silicide region 37, for example of tungsten silicide, arranged on top of the poly2 region 36. Spacing regions 38, for example of oxide and/or nitride, are formed at the sides of the stack 40 and a passivation layer 45, of dielectric material, for example oxide, is present on top of the semiconductor body 30 and surrounds the stack 40.

As is evident from FIGS. 3 to 5, the stack 40 has an elongated rectangular shape extending transversely to the active area 32; in particular, the stack 40 has a central portion extending on top of the active area 32 and end portions extending on top of the field insulation region 31.

The source and drain regions 41, arranged on the sides of the stack 40, inside the active area 32, are not visible in FIG. 6.

Next, the contact mask is made, and the contacts are opened. To this end, a photoresist layer is deposited and defined, so as to have openings where the contacts are to be formed, as illustrated in FIGS. 3–5 and 7, showing the resist mask 47 and the contact openings 48. In particular, the openings for connecting the poly1 region 34 and the poly2 region 36 are designated by 48*a*. As may be noted, the openings 48*a* are formed on top of the field insulation region 31, outside the active area 32. The position of the openings 48*a* varies according to whether the aim is to obtain the geometry of FIG. 3, FIG. 4 or FIG. 5.

Figure 7:
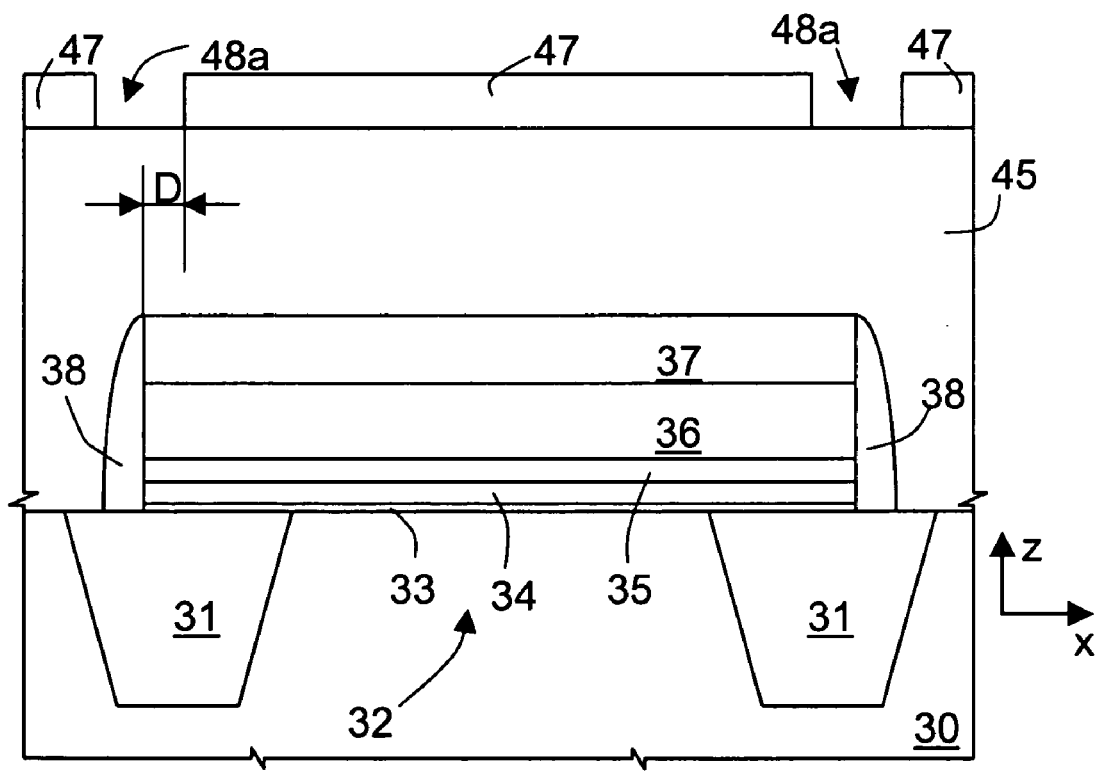

The position and the size of the openings 48*a* must be studied also taking into account the possible misalignment between the stack-definition mask and the contact mask 47; moreover, also the process tolerances regarding the two masks must be considered. FIG. 7 illustrates the minimum dimension D of the width (in the X direction) of each opening 48*a*, and hence of the electrical-connection regions 24 that are still to be formed.

In detail, we have:

$$D \geq Dis + T1 + T2,$$

where Dis is the possible misalignment between the stack definition mask and the contact mask 47, T1 is the dimensional tolerance linked to the process for the stack-definition mask, and T2 is the dimensional tolerance linked to the process for the contact mask 47.

As may be noted from the layouts of FIGS. 3 to 5, the sizes of the openings 48*a* are greater than those of the openings 48 designed to form the vias towards the regions in the active area (for example, towards the source and drain regions 41 and towards gate regions of the memory cells, not illustrated). However, the vias extending toward the semiconductor body 30 are formed partially on top of the stack 40 and enable a better cleaning of the walls of the stack 40, as indicated below.

Figure 8:
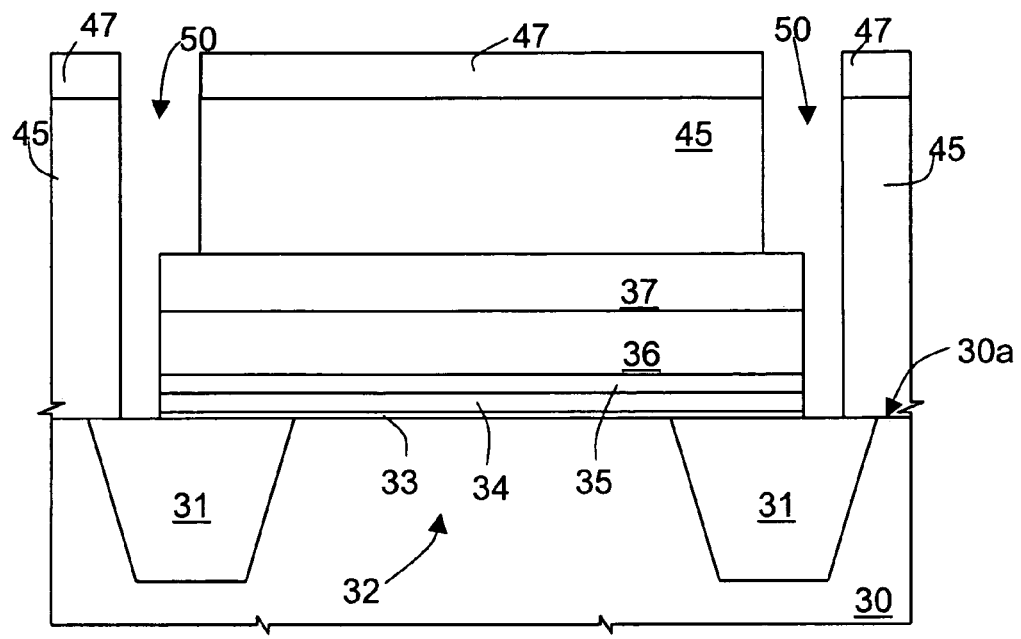

Using the resist mask 47, the passivation layer 45 and the spacers 38 are etched, forming vias 50, which extend from the surface of the passivation layer 45 as far as the surface 30*a* of the semiconductor body 30. The structure of FIG. 8 is thus obtained.

Etching of the passivation layer 45 thus cause formation of both the vias necessary for contacting the conductive regions of the device (in particular the source and drain regions), and the vias exposing the side walls of the ends of the stack 40 at least partially (according to the position of the openings 48*a*, illustrated in FIGS. 3 to 5).

In this latter step, the conservation of the correct morphology of the stack 40 is ensured by the good selectivity of the chemical agents used for etching the oxide of the passivation layer 45 and the spacers 38 with respect to the materials of the regions that form the stack 40, and hence with respect to the silicide and to the polysilicon. After the etching of the passivation layer, it is possible that the underlying insulation region 31 will be etched slightly on account of a slight over-etching. However, the extremely small size of the resulting over-etching does not adversely affect the functionality of the device considering the vertical dimensions of the insulation region 31.

Next (FIG. 9), a barrier layer 51, for example of Ti/TiN, and a metal layer 52, for example tungsten, are deposited in succession; the metal layer 52 filling the vias 50 to form, together with the barrier layer 51, the plug 22 contacting the various regions of the transistor as well as electrical connection regions 24 in the vias 50. The metal layer 52 is then removed from the surface of the passivation layer 45.

Finally, in a known way, a metal layer is deposited to obtain metal connection regions (metal 1); if desired, connections are made at more than one level of metallization, and the usual final manufacturing operations are carried out.

Figure 9:
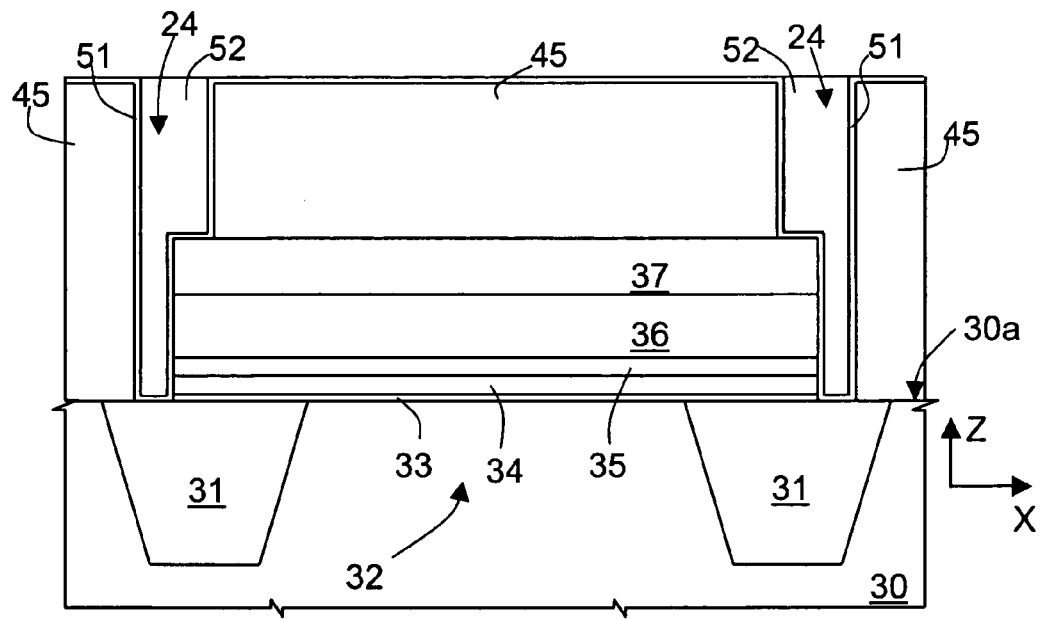

As may be seen from FIG. 9, the electrical connection regions 24 have a first width (in the X direction) equal to that of the openings 48a in the top area, on top of the stack 40, and a second width (also in the X direction) smaller than the first width, in the bottom area, where they extend on the sides of the poly1 region 34 and poly2 region 36 and electrically connect these two latter regions. In practice, the poly1 region 34 and poly2 region 36 have approximately the same size in the X direction (according to the verticality of the gate etch), and the electrical connection regions 24 form a step where they encounter the stack 40.

The device and the process described herein have the advantages outlined hereinafter.

The larger size of the vias 50 as compared to those of the vias leading to the other regions of the device enables, during contact etching, cleaning of the walls of the stack 40 from any possible oxidation that might form on the stack 40 and that could adversely affect the operation of the transistor, and thus ensures electrical continuity between the poly1 region 34 and the poly2 region 36.

The larger dimensions may compensate any possible misalignment and any possible process variations, as explained above. In this way, the contact is ensured between the poly1 region 34 and the poly2 region 36, and consequently the process offers good reliability.

Etching of the passivation layer 45 requires just one etching mask, and just one etching chemistry is sufficient; consequently, the manufacturing process is considerably less costly than the processes currently used.

A possible partial removal of the insulation region 31 does not, on the other hand, adversely affect the functionality of the device, since the electrical connection regions 24 are made at a distance from the active area 32 and, thanks to the good selectivity of the etching process, the insulation region 31 is not etched to an important extent. It follows that the process is reliable and does not present any particular critical aspects.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

Finally, it is evident that modifications and variations may be made to the transistor and to the process described herein, without thereby departing from the scope of the present invention. For example, the number of electrical connection regions 24 may vary, and electrical connection regions 24 may be provided on both sides of the active area 32. Furthermore, the same solution may be used for the electrical connection of two polysilicon layers in other types of devices integrated together with dual-polysilicon layer memory cells. In addition, the via 50 may be made also on the edge of the stack 40, instead of inside the stack 40.

The invention claimed is:

1. A MOS device comprising:
   a passivation layer;
   a stack covered by said passivation layer, said stack being formed by a first polysilicon region; a second polysilicon region being arranged on top of said first polysilicon region, and separated by an intermediate dielectric region; and
   an electrical connection region extending through said passivation layer and being in electrical contact with said first and second polysilicon regions, wherein, said electrical connection region extends laterally with respect to said first and second polysilicon regions and to said intermediate dielectric region, wherein the passivation layer contacts a side of the electrical connection region along an entire height of the side of the electrical connection region.

2. The MOS device according to claim 1 wherein said first and second polysilicon regions have substantially the same area in plan view and said electrical connection region presents a step in a vertical direction at said stack.

3. The MOS device according to claim 1 wherein said stack and said passivation layer extend on top of a semiconductor material body having a surface and wherein said electrical connection region extends as far as said surface.

4. The MOS device according to claim 3 wherein said semiconductor material body accommodates a field insulation region surrounding an active area, and wherein said stack has an elongated shape having a central portion extending on top of said active area and end portions extending on top of said field insulation region, wherein said electrical connection region extends on top of and terminates in contact with said field insulation region.

5. The MOS device according to claim 1, wherein said stack forms a gate region.

6. A MOS device comprising:
   a stack having a top surface, a bottom surface, and a first side, said stack comprising a first polysilicon region, an intermediate dielectric region being arranged on top of said first polysilicon region, and a second polysilicon region being arranged on top of said intermediate dielectric region;
   a passivation layer covering said stack and being in contact with said top surface, said first side; and
   an electrical connection region extending through said passivation layer, said electrical connection region having a lower portion in direct contact with said first polysilicon region, said intermediate dielectric region and said second polysilicon region along the first side of the stack and the passivation layer.

7. The MOS device according to claim 6 wherein at least part of said electrical connection region terminates on said top surface of said stack presenting a step.

8. The MOS device according to claim 6 wherein said stack further comprises a gate oxide region and a silicide region.

9. The MOS device according to claim 6 further comprising a semiconductor material body having a surface, wherein the bottom surface of said stack is in contact with said surface of said semiconductor material body, and said passivation layer extends as far as said surface.

10. A MOS device comprising:

a passivation layer;

a stack covered by said passivation layer, said stack having a first conductive region; a second conductive region being arranged on top of said first conductive region, and separated therefrom by an intermediate dielectric region; and an electrical connection region having a lower portion including a first side, a second side, a third side and a fourth side, said electrical connection region extending through said passivation layer and being in contact with respective lateral sides of said first, second conductive regions, said intermediate dielectric region along the first side of the electrical connection region, the lower portion of the electrical connection region being further in contact with said passivation layer along the second, third and fourth sides of the electrical connection region, wherein said stack and said passivation layer extend on top of a semiconductor material body having a surface and wherein said electrical connection region extends as far as said surface; and wherein said semiconductor material body accommodates a field insulation region surrounding an active area, and wherein said stack has an elongated shape having a central portion extending on top of said active area and end portions extending on top of said field insulation region, wherein said electrical connection region extends on top of and terminates in contact with said field insulation region.

11. The MOS device of claim 10 wherein said first and second conductive regions have substantially the same area in plan view and said electrical connection region is in contact with a portion of a top surface of said stack.

12. The MOS device of claim 1 wherein the stack is formed on a semiconductor body having a top surface, and the side of the electrical connection region in contact with the passivation layer extends from the top surface of the semiconductor body.

13. The MOS device of claim 1 wherein the passivation layer contacts three sides of the electrical connection region along an entire height of the three sides of the electrical connection region.

14. The MOS device of claim 6 wherein the lower portion of the electrical connection region is in contact with the passivation layer on three sides of the electrical connection region.

* * * * *